United States Patent [19]

Prud'Homme

[11] Patent Number: 4,822,523

[45] Date of Patent: Apr. 18, 1989

[54] ELECTRICALLY CONDUCTIVE, POTENTIALLY ADHESIVE COMPOSITION

[75] Inventor: Christian Prud'Homme, Lyons, France

[73] Assignee: Ciba-Geigy Corporation, Ardsley, N.Y.

[21] Appl. No.: 109,668

[22] Filed: Oct. 16, 1987

[30] Foreign Application Priority Data

Oct. 20, 1986 [FR] France .................. 86 14851

[51] Int. Cl.$^4$ .................................. H01B 1/06
[52] U.S. Cl. ........................... 252/511; 252/514; 252/516; 252/512; 524/439; 524/413; 524/496
[58] Field of Search ............ 252/514, 512, 511, 516; 524/439, 440, 495, 496, 413; 525/474, 477, 478; 528/10, 15, 31, 33, 37, 43

[56] References Cited

U.S. PATENT DOCUMENTS

| | | | |
|---|---|---|---|
| 3,159,601 | 12/1964 | Ashby | 260/46.5 |
| 3,220,972 | 11/1965 | Lamoreaux | 260/46.5 |
| 4,144,648 | 3/1979 | Grovender | 339/75 |
| 4,233,427 | 11/1980 | Bargain et al. | 525/478 |
| 4,431,982 | 2/1984 | Monroe et al. | 252/511 |
| 4,589,999 | 5/1986 | Vasta | 252/511 |

OTHER PUBLICATIONS

Chem. Abst. 101, 142357z (1984).
Chem. Abst. 88, 31102f (1978).

*Primary Examiner*—Josephine Barr
*Attorney, Agent, or Firm*—Luther A. R. Hall

[57] ABSTRACT

The present invention relates to electrically conductive potentially adhesive compositions and to films formed from these compositions which are capable of being employed in particular for the adhesive bonding of the surfaces of electronic devices.

These compositions are characterized in that they comprise a thermoplastic polyblock organopolysiloxane copolymer with elastomeric properties and particles whose surface at least is electrically conductive and, if appropriate, a solvent or diluent.

16 Claims, No Drawings

ELECTRICALLY CONDUCTIVE, POTENTIALLY ADHESIVE COMPOSITION

The present invention relates to potentially adhesive electrically conductive compositions which are capable of being employed in particular for the adhesive bonding of the surfaces of electronic devices.

There are known adhesive, electrically conductive, compositions which consist of an epoxide resin in which there are dispersed flakelets of silver or particles of other electrically conductive metals such as gold, nickel and copper. A distinction is made between the "single-component" compositions, whose storage and transport require refrigeration and whose storage life at a normal ambient temperature of the order of 25° C.) is limited, and two-component compositions, the major disadvantage of which is the need for mixing the resin with its hardener before use. Both types of compositions are the result of a compromise between the contradictory requirements of a satisfactory lifetime and a rapid crosslinking rate. The application of compositions of this nature calls for the crosslinking of the epoxide resin at a relatively high temperature and for a sufficient time, with the compositions also containing a catalyst, a hardener and various ingredients in order to accelerate or retard the crosslinking.

The assembly of, for example, a chip onto a substrate such as a mounting frame ("lead frame" in U.S. terminology) is performed by application of a thin film of an adhesive of this type followed by the polymerization in the region of 100° to 180° C. for a period which is generally between 3 and 60 minutes. Notwithstanding the fact that the chip fastened in this manner is difficult to peel off, subsequent welding operations of, for example, the legs and the connecting wires between the chip and the substrate, by thermocompression, and the processes of encapsulating the device may modify the resin.

Furthermore, epoxide resins filled with silver particles form rigid films which have changed size during the crosslinking. These films are incapable of satisfactorily withstanding the stresses resulting, for example, from differential thermal expansions. While the ruptures, cracks and losses of adhesion which are not very likely to appear on adherent or adhesive surfaces of small dimensions such as those of a square with a one-millimeter side, these defects become very pronounced when the surface coated with the conductive adhesive is larger in size, such as that of a square with a side of several centimeters. Furthermore, the adherent surfaces bonded by sandwiching a layer of conductive adhesive are liable to possess very different thermal expansion coefficients and, by virtue of this fact alone, to give rise to additional stresses which are all the more sensitive the larger the surfaces to be bonded. Insofar as the tendency of the present technologies is, on the one hand, towards maximum integration and, on the other hand, towards an increasing development of the hybrid technology and hence an appreciable increase in the surfaces to be bonded, which are frequently of different kind, the problems related to the rigidity of the adhesive layer cannot be overlooked.

It would also be possible to envisage adhesive, electrically conductive compositions consisting of a polyimide resin and a solvent like N-methylpyrrolidone or an acidic polyamide and a solvent of the same type, which are filled with silver particles. Compositions of the first type may be deposited onto a surface to be bonded and will then be heated from 140° to 200° C. to evaporate the solvent. Compositions of the second type may be subjected to the same kind of treatment, but the heating will cause cyclization with the generation of water, and this will be seen as the formation of bubbles in the film which is deposited. In addition, in the presence of silver, the $N-(CO_2)-C_6H_4$ rings rupture more or less easily under the effect of the temperature, and this gives rise to a product degradation. In addition, these compositions, which do not permit the manufacture of self-supporting films and which are always in liquid form in a solvent medium, give rise to films with a thermal expansion coefficient which is low but which remains very high in relation to those of the elements to be bonded.

There are also known compositions which are electrically conductive but which are lower in adhesive power, which withstand the differential expansions better and which consist of a silicone elastomer and of silver particles. However, these compositions, which are capable of being crosslinked under the effect of the temperature, encounter the same disadvantages as the epoxide adhesives in respect of the compromise to be found between acceptable cross-linking conditions and a suitable lifetime when stored under normal conditions.

Furthermore, these elastomers require the presence of reinforcing fillers (such as fumed silica) and a crosslinking operation in order to be capable of giving rise to films or circuit boards whose mechanical properties are capable of being assessed although inadequate. These fillers are furthermore incompatible with the search for a satisfactory electrical conductivity.

Lastly, more recently (cf. Japanese patent application No. 59/107,528) there have been proposed electrically conductive compositions consisting of a para-phenylene polysulfide and silver particles, the application of the thermoplastic being carried out thermally, at an elevated temperature (220° C.). Films formed from such compositions are rigid and do not withstand differential expansions in a satisfactory manner. In addition, films formed from such compositions are not self-supporting.

In view of the present tendencies of the technology of manufacture of electronic devices, of their integration density and of the increasing essential requirements for automated production, it was necessary to provide potentially adhesive electrically conductive compositions whose application and storage are made easier by the absence of chemical reaction—in the sense that there is no condensation, crosslinking or addition—which, owing to their reversible adhesive or potentially adhesive nature, make it possible to envisage the replacement or the repair of defective components before refitting and which are capable of better withstanding the differential stresses while exhibiting high ionic purity. It was also necessary to provide such compositions capable of giving rise to films or circuit boards with improved mechanical properties and not requiring the presence of reinforcing fillers.

The subject of the present invention is therefore a potentially adhesive electrically conductive composition containing a thermoplastic polyblock organopolysiloxane copolymer possessing elastomeric properties and particles whose surface at least is electrically conductive. The compositions according to the invention may also contain a solvent or diluent.

Another subject of the present invention is a flexible, if appropriate self-supporting, film formed from the compositions in question, a device comprising at least one face coated with a film formed from the compositions in question and a device comprising at least three superposed layers, the middle layer being a film formed from the compositions in question.

An additional subject of the present invention is the use of the compositions according to the invention in adhesive bonding by surface mounting of an encapsulated component having legs intended to be fastened onto electrically conductive tracks present on a base; a small fragment of composition such as a drop may be deposited under the component in order to position it and to hold it in place while the remelting of the beads of Au-Si eutectic situated at the ends to be joined, either of the tracks or of the legs, is carried out. A small fragment of composition may be deposited alternatively or conjointly at each end either of the tracks or of the legs of the component as a replacement for the beads of eutectic just mentioned.

A further subject of the invention is the use of the compositions according to the invention for adhesive bonding of an active component onto a substrate in the technology known as that of hybrid circuits; the side of the component facing the substrate will be coated with a film of composition or will be brought into contact with such a film deposited onto the substrate in order to be fastened thereon, it being possible for the connections between the electrically conductive tracks present on the same face of the substrate and the added component to be produced by means of a gold or aluminium wire.

Also envisaged is the adhesive bonding of a chip onto a mounting frame (a technique which is more widely known by the English name of "die-bonding").

Another subject of the invention is the use of a film formed from a composition according to the invention arranged in a frame which is in most cases planar and circular and slightly larger in diameter than that of a silicon wafer, the reverse side of the wafer (the face which is generally unpolished and opposite that on which semiconductive components are or will be developed) coming into intimate contact with one of the faces of the said film, the film-wafer assembly being made integral before being cut up, in most cases by sawing, to form a plurality of chips comprising a thin layer of the film in question on their reverse side. Each of the said chips which are coated in this manner may, for example, be lifted up by an automatic device and then moved and positioned, if appropriate, with a view to being adhesively bonded onto a substrate or a mounting frame.

The film arranged in the frame (or drum) may be so arranged by means of a film or of a sheet of another material situated under the face of the potentially adhesive film which is opposite that onto which the silicon wafer will be positioned. The potentially adhesive film may be in the form of a continuous surface or in the form of a plurality of unitary surfaces of more or less complex outlines which can be produced, particularly by serigraphy.

The potentially adhesive electrically conductive compositions according to the present invention contain at least one polyblock organopolysiloxane copolymer having elastomeric properties.

These copolymers consist of a plurality of repeat units corresponding to one and/or the other of the 2 average formulae below:

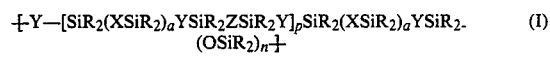

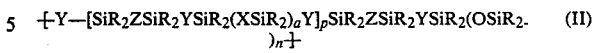

in which the various symbols have the following meaning:

the symbols Y, which are identical or different, denote linear or branched alkylene radicals containing from 2 to 6 carbon atoms, the symbols R, which are identical or different denote:

alkyl and haloalkyl radicals containing from 1 to 4 carbon atoms, cycloalkyl radicals containing from 3 to 8 carbon atoms, or aryl and haloaryl radicals containing from 6 to 8 carbon atoms, the symbols X, which are identical, denote:

linear or branched alkylene radicals containing from 1 to 8 carbon atoms, or divalent organic radicals corresponding to the formula (III)

$$(CH_2)_x Q T Q (CH_2)_x \qquad (III)$$

in which:

the symbols Q, which are identical, denote one of the groups —O— and —OCO—(—OCO being linked to T via the radical —CO—), the symbol T denotes a divalent monocyclic hydrocarbon radical containing from 6 to 8 carbon atoms or a divalent organic radical containing from 10 to 22 carbon atoms consisting of 2 hydrocarbon rings fused to each other or linked by a valency bond or by one of the groups of formulae —O—, —CH$_2$—, —C(CH$_3$)$_2$ or —Si(R')—$_2$ (R' being an alkyl radical containing from 1 to 3 carbon atoms), and the symbols x, which are identical, denote 1, 2 or 3, divalent hydrocarbon radicals corresponding to the formula (IV):

$$(CH_2)_b-T-(CH_2)_b \qquad (IV)$$

in which:

the symbol T has the meaning given in formula (III) and the symbols b, which are identical, denote 0, 1 or 2, the symbols Z, which are identical, have the meaning given for X but cannot correspond to the formula (III), the symbol a denotes 0 or 1, the symbol p denotes any number from 1 to 120 inclusive, and the symbol n denotes any number from 1 to 1,000 inclusive.

By way of examples, the symbols Y may denote ethylene, 1,3-propylene, 1,2-propylene, 1,4-butylene, 1,3-butylene, 2,3-butylene, 1,5-pentylene, 1,4-pentylene, 1,6-hexylene, 2,4-hexylene, 1,4-cyclohexylene and 1,3,-cyclohexylene radicals.

The symbols Y preferably denote ethylene radicals.

By way of examples, the symbols R may denote the following radicals: methyl, ethyl, n-propyl, n-butyl, 3,3,3-trifluoropropyl, cyclohexyl, methylcyclohexyl, phenyl, tolyl, xylyl, chlorophenyl, dichlorophenyl, trichlorophenyl and trifluoromethylphenyl.

The symbols R preferably denote methyl, ethyl, n-propyl or phenyl radicals and, advantageously, methyl radicals.

The symbols X and Z denote: linear or branched alkylene radicals containing from 1 to 8 carbon atoms.

By way of illustration there may be mentioned methylene, ethylene, 1,3-propylene, 1,4-butylene, 2,3-butylene, 1,6-hexylene and 1,8-octylene radicals.

These alkylene radicals are preferably ethylene and 1,4-butylene.

Divalent organic radicals (with the exception of the symbols Z) corresponding to the formula (III):

$(CH_2)_x$—QTQ$(CH_2)_x$, in which: the symbol T denotes divalent radicals chosen from the group consisting of: monocyclic radicals of formulae:

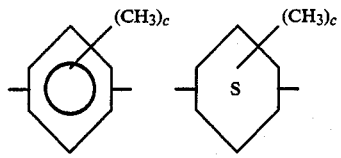

in which the symbol c denotes zero, 1 or 2 (the symbol S shows that the ring is saturated).

Preferably these monocyclic radicals are para-phenylene radicals.

Bicyclic hydrocarbon radicals of formulae:

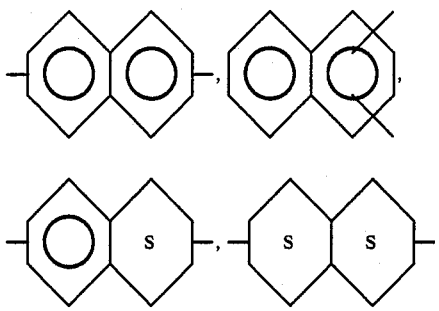

substituted by one or two methyl radicals if desired. These bicyclic radicals are preferably 1,5- and 2,7-naphthylene radicals, radicals formed by 2 phenylene and/or cyclohexylene rings (each ring being substituted by one or 2 methyl radicals if desired) linked to each other by a single valency bond or by one of the groups —O—, —CH$_2$—, —C(CH$_3$)$_2$— or —Si(R')$_2$—; in this last group the symbols R' denote methyl, ethyl or n-propyl radicals.

These radicals are preferably chosen from those of formulae:

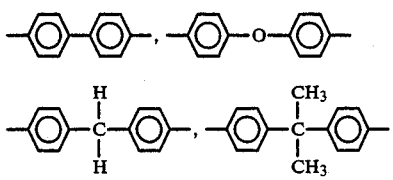

From the combination of the various meanings of T with the various meanings of Q and X indicated above it follows that the divalent organic radicals of formula (III) may correspond to the following formulae, given by way of specific examples:

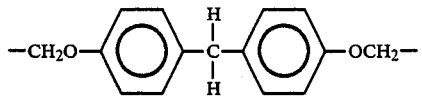

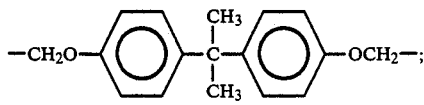

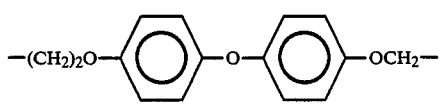

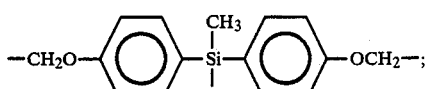

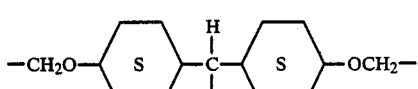

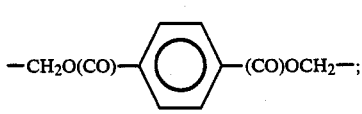

The divalent radicals of formual (III) preferably correspond to the following individual formulae:

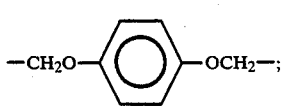

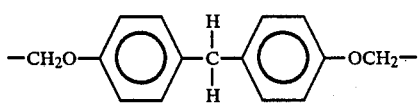

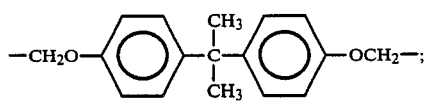

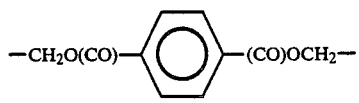

divalent hydrocarbon radicals corresponding to the formula (IV):

$$-(CH_2)_b-T-(CH_2)_b \quad (IV)$$

On the basis of the various meanings of T and b, as set out above, the radicals corresponding to the following formulae may be mentioned by way of specific examples of radicals of formula (IV):

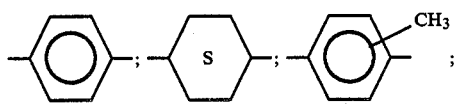

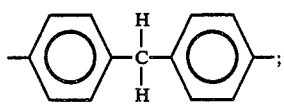

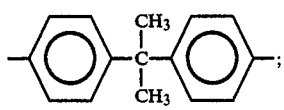

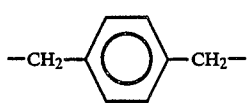

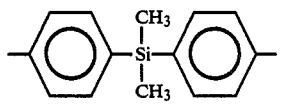

Preferably, the radicals (IV) correspond to the following individual formulae:

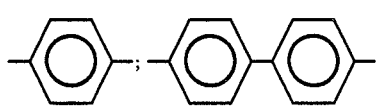

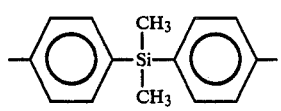

Advantageously, p denotes any number from 1 to 80 inclusive.

Advantageously, n denotes any number from 1 to 400 inclusive.

The formulae (I) and (II) at the beginning of the present description denote repeat units which are identical or different, according to the individual meanings of X, Z, a and Y. Thus, the repeat units are identical on the assumption that:

X and Z have the only meanings given for Z above, and a equals 1.

Furthermore, when X and Z are identical, both formulae convert into a single formula (V), below:

$$\{Y-(SiR_2ZSiR_2Y)_{2p}SiR_2ZSiR_2YSiR_2(OSiR_2)_n\} \quad (V)$$

This formula may be condensed into (VI), below:

$$\{Y-(SiR_2ZSiR_2Y)_{2p+1}-SiR_2(OSiR_2)_n\} \quad (VI)$$

The thermoplastic polyblock copolymers having elastomeric properties and employed within the scope of the present invention may be prepared according to two distinct processes, each process being carried out in two stages:

According to the first process, the polyblock copolymers consisting of repeat units corresponding more especially to formula (I) are prepared.

To this end, in a first stage, the rigid sequence of formula (1):

$$\{Y\{SiR_2(XSiR_2)_aYSiR_2ZSiR_2Y]_pSiR_2(XSiR_2)_aYSiR_2(OSiR_2)_n\} \quad (I)$$

is prepared by polyaddition in the presence of a suitable catalyst between (p+1) units of a diethylenic silicon compound of formula (2):

$$Y^*SiR_2(XSiR_2)_aY^* \quad (2)$$

and p units of the dihydrogenated silicon compound of formula (3):

$$HSiR_2ZSiR_2H \quad (3)$$

in formulae (1) and (2) above, Y* denotes monovalent hydrocarbon radicals containing from 2 to 6 carbon atoms, each containing an ethylenic bond; the saturation of this ethylenic bond by a —SiH group converts them into radicals Y whose definition, as well as those of the other symbols which appear in formula (1) to (3) above, is the same as that indicated earlier.

The particular rigid sequence of formula (4):

$$Y^*(SiR_2ZSiR_2Y)_{2p}SiR_2ZSiR_2Y^* \quad (4)$$

may be obtained, as indicated above [in formula (2) X=Z and a=1], but also by polyaddition of the silicon compound of formula (5):

$$Y^*SiR_2ZSiR_2H \quad (5)$$

2p times to itself, using one unit of the compound of formula (6):

$$Y^*SiR_2ZSiR_2Y^* \quad (6)$$

as a blocking component.

Obviously, in formulae (4) to (6), Y* has the same meaning as that given in the case of the formulae (1) and (2).

According to the second process, polyblock copolymers consisting of repeat units corresponding more particularly to the formula (II):

—[—Y—[SiR$_2$ZSiR$_2$YSiR$_2$(XSiR$_2$)$_a$Y]$_p$SiR$_2$ZSiR$_2$YSiR$_2$(OSiR$_2$)$_n$—]—      (II)

are prepared.

To this end, in a first stage, the rigid sequence of formula (8):

H—[—SiR$_2$ZSiR$_2$YSiR$_2$(XSiR$_2$)$_a$Y]$_p$SiR$_2$ZSiR$_2$H      (8)

is prepared by polyaddition, with the aid of a suitable catalyst, between p+1 units of the dihydrogenated silicon compound of formula (3):

HSiR$_2$—Z—SiR$_2$H      (3)

and p units of the diethylenic silicon compound of formula (9):

Y*SiR$_2$(XSiR$_2$)$_a$Y*      (9)

According to an alternative form, the particular rigid sequence of formula (10):

H(SiR$_2$ZSiR$_2$Y)$_{2p}$SiR$_2$ZSiR$_2$H      (10)

may be obtained not only by the hurried technique [in formula (9) X is then chosen identical with Z and a denotes 1] but also by polyaddition of the monoethylenic hydrosilicon compound of formula (5):

Y*SiR$_2$—Z—SiR$_2$H      (5)

2p times to itself, using one unit of the compound of formula (3) as a blocking component.

When the rigid sequence of formula (1) or (4) has been prepared, at least one of its units is reacted, in a second stage, in the presence of a suitable catalyst, with at least one unit of an α,ω-dihydropolydiorganosiloxane of formula (7):

HSiR$_2$(OSiR$_2$)$_n$H      (7)

in which R$_2$ and n have the meanings which were given to them in formula (I).

The polyblock copolymer produced in this manner consists of repeat units corresponding to the formula (I) or (V).

When the rigid sequence of formula (8) or (10) has been prepared, at least one of its units is reacted, in the presence of a suitable catalyst, with at least one unit of an α,ω-diethylenic polydiorganosiloxane of formula (11):

Y*SiR$_2$(OSiR$_2$)$_n$Y*      (12)

The polyblock copolymer produced in this manner consists of repeat units corresponding to the formula (II) or (V).

The monomers of the above formulae (2), (6), (3) and (5) may be synthesized with the aid of traditional reactions of organic and organosilicon chemistry, in particular by means of syntheses employing magnesium, which are themselves well known.

The polymers of formula (7) and (11) are commercially available silicones.

The molecular mass of the α,ω-dihydropolydiorganosiloxanes of formula (7) is determined by the nature of the substituents R and above all by the value of n which may range from 1 to 1,500 and preferably from 10 to 800. Their viscosities generally range from a few cPl (at 25° C.) to 500,000 cPl (at 25° C.). Similarly, the molecular mass of the polymers of formula (11) is determined chiefly by the value of n which may range from 1 to 1,500 and, preferably, from 10 to 800. Their viscosities, measured at 25° C., generally range from a few cPl to 500,000, cPl.

Polymers in which R denotes methyl groups and n is from 1 to 400 inclusive are advantageously employed as polymer of formula (7) and (11).

p-Bis(dimethylsilyl)benzene:

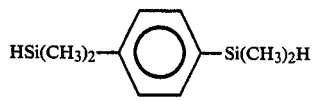

may be mentioned by way of example of monomers of formula (3) which are particularly suitable for making use of the invention.

By way of example of monomers of formula (2) which are more particularly suitable for making use of the invention there may be mentioned:

p-bis(dimethylvinylsilyl)benzene:

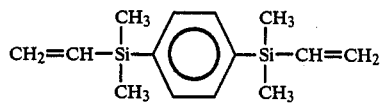

dimethyldivinylsilane

CH$_2$=CH—Si(CH$_3$)$_2$—CH=CH$_2$      (M$_2$)

2,2-bis[4-dimethylvinylsilyl)methoxyphenyl]propane:

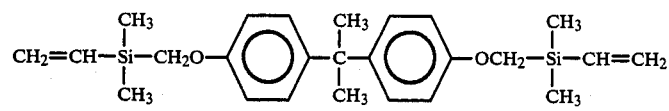

p-bis[(dimethylvinylsilyl)methoxy]benzene:

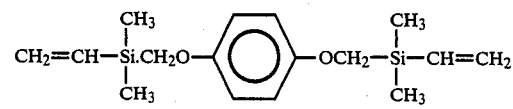

p-(Dimethylvinylsilyl)dimethylsilylbenzene:

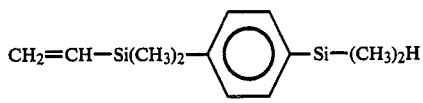

may be mentioned by way of example of a monomer of formula (5) which is particularly suitable for making use of the invention.

By way of examples of rigid sequences forming part of the composition of the block copolymers, there may be mentioned:

The polymer with a number average molecular mass of 4,100 and a melting point of 180° C., produced from p-bis(dimethylsilyl)benzene and the monomer ($M_1$), corresponding to the formula (4) in which $Y^*$ denotes the $CH_2=CH-$ group, R a mthyl group, Z a para-phenylene radical, Y a $-CH_2-CH_2-$ group and p has an average value of the order of 5. This sequence crystallizes spontaneously.

The polymer with a number average molecular mass of 2,970 and a melting point of 136° C., produced from p-bis(dimethylsilyl)benzene and the monomer ($M_2$), corresponding to the formula (1) in which $Y^*$, Y, Z and R have the particular meaning above, a is equal to 0 and p has an average value of the order of 9.8. This sequence crystallizes spontaneously.

The polymer with a number average molecular mass of 3,200 and a melting point of 128° C., produced from p-bis(dimethylsilyl)benzene and the monomer ($M_3$), corresponding to the formula (1) in which $Y^*$, Y, Z and R have the particular meaning given already, a equals 1, X denotes the radical:

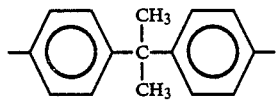

and the average value of p is of the order of 5. This sequence crystallizes very slowly at 25° C.; its crystallization may be accelerated by an annealing operation.

The polymer with a number average molecular mass of 2,660 and a melting point of 122° C., produced from p-bis(dimethylsilyl)benzene and the monomer ($M_4$), corresponding to the formula (1) in which $Y^*$, Y, Z and R have the particular meaning given already, a equals 1, X denotes the radical:

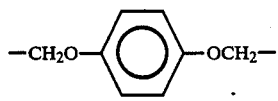

and the average value of p is of the order of 5. This sequence crystallizes spontaneously.

In practice, in the first stage of the first process, polyaddition is performed between (p+1) units of the diethylenic compound of formula (2) and (p) units of the dihydrogenated compound of formula (3) or between (2p) units of the compound of formula (5) and one unit of the blocking component of formula (6) in order to produce, in both cases, a rigid sequence with the chain blocked at its end by $Y^*$ groups containing ethylenic unsaturation. In both cases the polyaddition in question takes place under the usual conditions for hydrosilylation reactions.

The reaction is advantageously catalysed by platinum chloride derivatives modified by the action of various organic compounds (cf. U.S. Pat. Nos. 3,220,972 and 3,159,601, for example). The quantities of catalyst which are introduced are normally small and are generally between 5 and 50 ppm of platinum, based on the reactants.

The hydrosilylation reaction may be carried out in the absence of diluents or in a diluent medium; it is preferable to operate in a diluent medium for better controllability of the reaction and to avoid bulk solidification and untimely precipitation of the polymers.

The diluents employed may be chosen from:

aliphatic and alicyclic hydrocarbons, halogenated or otherwise, such as pentane, hexane, heptane, chloroform, dichloroethane, tetrachloroethane, methylene chloride, cyclohexane, methylcyclohexane or decalin, aromatic hydrocarbons, halogenated or otherwise, such as toluene, xylene, tetralin, chlorobenzene or orthodichlorobenzene, and aliphatic esters of monocarboxylic acids such as ethyl, butyl or amyl acetate.

Preferably the composition comprises a solvent or diluent chosen from the group consisting of:

chlorinated aliphatic hydrocarbons such as chloroform, dichloroethane, tetrachloroethane, trichloroethylene, perchloroethylene and methylene chloride, aromatic hydrocarbons, halogenated or otherwise, such as toluene, xylene, tetralin, chlorobenzene and orthodichlorobenzene.

The quantities and the nature of the diluents to be employed can vary; they depend, in fact, on various factors such as the reactivity of the starting materials and their degree of solubility, and the increase in the viscosity of the reaction medium during the hydrosilylation reaction. It is advantageous, however, to operate with dilutions involving 2o to 90% by weight of diluents.

The reaction temperature may vary within wide limits, according to the operating procedure adopted (use or nonuse of diluents, reaction carried out at a pressure below, equal to or above atmospheric pressure, nature of the catalyst). It is preferable to employ temperatures which lie in the range from 40° to 220° C.

The reaction time is also variable (it depends on the parameters listed above) and is determined by taking samples which demonstrate the disappearance of the reactive SiH and Si$Y^*$ bonds. In general, this time ranges from 10 minutes to 2 hours.

When the rigid sequence (1) or (4) has formed in a reaction medium containing diluents, it may be isolated by precipitation (unless it is insoluble in this medium). To this end, a diluent, or diluents, in which the block is insoluble or poorly soluble (for example methanol, ethanol or n-propanol) are added to the reaction mixture; the block precipitates in the form of fine particles which may then be filtered off, washed and dried.

When the rigid sequence has formed in a homogeneous reaction medium containing 1 diluent or diluents, the block may, advantageously, not be isolated and the second stage, corresponding to the polyaddition reaction between the block and the dihydropolydiorganosiloxane, then takes place in this reaction medium, if appropriate, in the presence of the electrically conductive fillers, to be discussed in greater detail in the continuation of the present description.

Similarly, in the first stage of the second process, the quantities of the compounds wich are present or the presence of a blocking component of formula (3) make it possible to produce a sequence which is blocked at the end of the chain, this time by SiH groups. These polyadditions may be performed under the hydrosilylation conditions (catalyst, diluents, reaction temperature, time, and the like) which have just been indicated. The rigid blocks thus produced can, in their case as well, be isolated from their reaction medium as has been indicated earlier. It is also possible to continue the second stage in this same reaction medium.

During the second stage of the first process, the quantities of the rigid sequence of formula (1) or (4) and of the dihydrodiorganopolysiloxane of formula (7) which are present are determined by the retained values of the ratio of the number of ethylenic groups Y* in the compound (1) or (4) to the number of the SiH groups in the compound (7). While this ratio may range between 0.7 and 1.3, it is preferably between 0.9 and 1.1 insofar as it applies to polyblock copolymers of high molecular masses.

While the copolymers consisting of repeat units (I) or (VI) must theoretically be terminated at each end of their chain by SiH and/or SiY* groups, it is also possible to have other blocking groups by adding, during the addition reaction in this stage, either organosilane compounds containing a single SiH group (such as trimethylmonohydrosilane), or, preferably, organosilicon or organic compounds containing a single ethylenic group (such as trimethylvinylsilane and styrene).

The addition reaction in question is conducted in a similar manner to that described for the first stage. Since, however, the hydrosilylation reaction involves compounds of higher molecular weight, it is natural to employ a temperature range which is slightly different and lies between 60° and 250° C., approximately, and a time which may be a little longer and, depending on the reactivity of the compounds in question, is between 30 minutes and about 10 hours.

It is preferable to operate using dilutions comprising from 30 to 95% by weight of diluents, with the dihydropolysiloxane (7) being advantageously introduced directly into the homogeneous reaction medium (containing diluents) in which the rigid sequence of formula (1) or (4) above has been produced. It is then sometimes necessary to add supplementary quantities of diluents and/or of catalyst in order to obtain, in this second stage, a medium which is homogeneous and reactive throughout the polyaddition reaction.

Similarly, in the second stage of the second process, the quantities of the rigid sequence of formula (8) or (10) and of the $\alpha,\omega$-diethylenic polydiorganosiloxane of formula (11) which are present are determined by the retained values of the ratio of the number of ethylenic groups Y* in the compound (11) to the number of the SiH groups in the compound of formula (8) or (10), it being possible for this ratio to be between 0.7 and 1.3 and, preferably, between 0.9 and 1.1.

While the copolymers consisting of repeat units (II) or (VI) must theoretically be blocked at the ends of their chains by SiH and/or SiY* groups, it is possible to have other blocking groups at the end of the chain in the same manner as has been indicated and implemented earlier.

Furthermore, since the conditions of the hydrosilylation reaction are similar to those described for the second stage of the first process, it seems unnecessary for them to be detailed here.

Although the preparation of the polyblock copolymers may be performed in a single stage by heating the various necessary reactants, if appropriate in the presence of diluents, at a temperature of the order of 80° to 260° C. for a period ranging from 1 to 30 hours, it should be noted that it is preferable to operate in two stages according to either of the processes mentioned above in order to produce copolymers of better qualities.

Whatever the process by which they are produced, these copolymers may be isolated from the reaction media in which they have been produced using known techniques, similar to those employed for the isolation of the rigid blocks. They may then be washed and dried. The copolymers may, however, be employed in the form of homogeneous reaction mixtures.

In the case where the copolymers are in suspension in the reaction mixture, it will be possible to isolate them by filtration or devolatilization at a pressure below atmospheric pressure. If the reaction mixtures contain no diluents, they consist, in practice, of the copolymers by themselves and these may then be employed in the crude state or after purification by dissolution and precipitation.

Whatever the preparative procedure employed, the polyblock copolymers are solid substances with elastomeric properties, but having a melting range extending from 60° to 250° C., and they are therefore thermoplastic elastomers. Their proportion of crystalline masses depends on the mechanical and thermal stresses to which they have previously been subjected. They have a variable rate of crystallization which is due to the nature of the structural sequencing forming their repeat units.

When this rate of crystallization is slow, it is preferable to maintain them at the appropriate temperature of formation of the crystalline masses for a period ranging from 1 to 48 hours. After this heat treatment the copolymers exhibit their maximum mechanical properties. A treatment of this kind may, of course, be carried out on the copolymer containing the particles whose surface at least is electrically conductive.

The range of the values of the mechanical properties of these copolymers is very wide; it is a function of the constitution of their repeat units and of the percentage of blocks of formula $-SiR_2(OSiR_2)_n-$ which these repeat units contain.

This percentage is highly variable; it is recommended, however, to employ copolymers which contain from 10 to 80% of their weight of diorganopolysiloxane blocks $SiR_2(OSiR_2)_n-$.

The potentially adhesive electrically conductive compositions according to the present invention contain particles whose surface at least is electrically conductive. The electrically conductive material is chosen from carbon, titanium carbide, silver and gold. The use of silver is recommended. These particles may comprise a conductive or nonconductive core clad or coated with the electrically conductive material. The core may consist of an electrically conductive metal identical with or different from that of their surface, such as nickel, lead and copper. In most cases the particles are in the form of powder, flakelets or fibrils whose average size is between 0.1 and 50 microns. Silver in the form of flakelets is advantageously employed.

The useful quantity of electrically conductive particles within the potentially adhesive electrically conductive composition according to the invention will depend in particular on the size of the particles, on their morphology and on their electrical conductivity. For particles of a given type, the lower limit is that at which the composition changes towards excessively high resistivities and the upper limit is that at which the adhesive and/or film-forming properties of the composition exhibit marked deterioration.

The person skilled in the art and wishing to obtain a given electrical conductivity and given adhesive and/or film-forming properties which can be determined, respectively, by measuring an electrical conductivity, a stripping resistance or shear strength, hardness and/or modulus of elasticity, under specified conditions and in accordance with the usual standards and methods, will be capable of specifying the optimum quantity of electrically conductive particles to be incorporated in the composition in the case of a given polymer, and of doing this without, however, resorting to experimentation going beyond the scope of mere routine.

For example, carbon particles which are available in an average size of between 0.04 and 10 microns can be employed in a proportion of 15 to 30% by weight of the solids content of the potentially adhesive electrically conductive composition.

Where particles of titanium carbide which are available in an average size of between 0.1 and 50 microns are concerned, these can be employed in a proportion of 80 to 85% by weight of the solids content of the potentially adhesive electrically conductive composition.

The particles of silver which are available in this same size range can be employed in a proportion from 60 to 85% by weight of the solids content of the potentially adhesive electrically conductive composition. It is preferable to resort to particles whose morphology is capable of giving the maximum contact per unit weight, such as flakelets.

Various conventional methods may be employed to incorporate the particles in the copolymer. The particles may be incorporated merely by being mixed with the powdery copolymer or in the molten state.

It is also possible to incorporate the particles merely by mixing them with a solution of dispersion of the copolymer in a solvent or diluent, which may be identical to or different from those or that which has been used in its preparation.

However, bearing in mind the method of preparation of the copolymer in two stages according to either of the processes indicated earlier, it is also possible to incorporate the said particles into the reaction medium containing only the rigid sequence of the copolymer (at the end of the first stage) and then to "finish" the copolymer (second stage) as indicated earlier, since the presence of the particles in question does not interfere with the reactions in question during the second stage. It is then possible to evaporate off the solvent under reduced pressure or, where appropriate, to precipitate the filled copolymer when the latter settles out relatively easily and then to recover the filled solid simply by filtering.

For satisfactory homogeneity of the mixture it is preferable to incorporate the particles in question in a solution of the copolymer.

By way of examples of a copolymer which can be employed in the preparation of the compositions according to the invention there may be mentioned those consisting of repeat units of the average formula which follows:

Formula 1

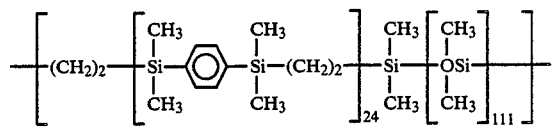

Formula 2

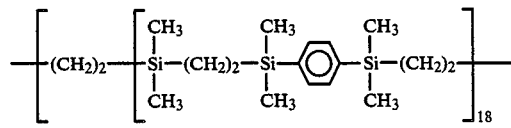

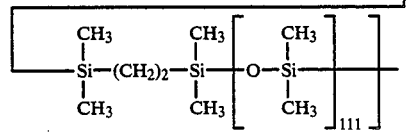

Formula 3

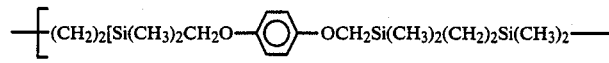
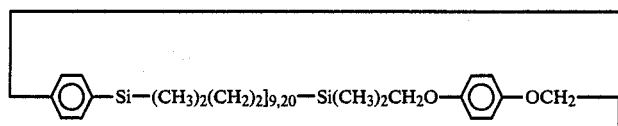
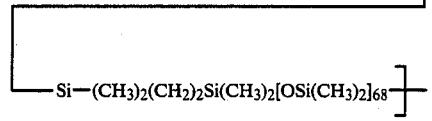
Formula 4
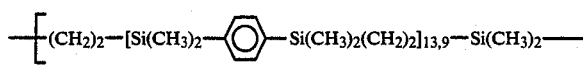
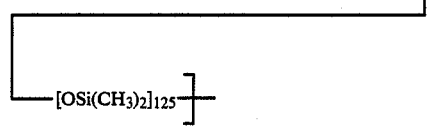
Formula 5
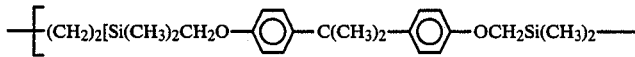
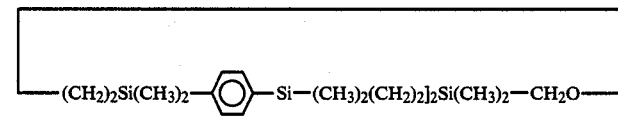
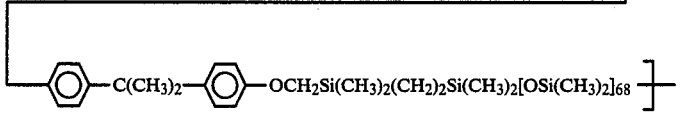
Formula 6
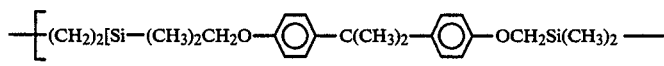
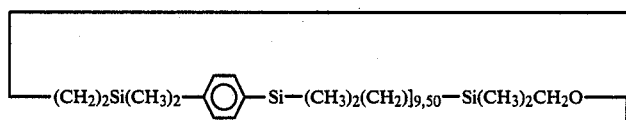
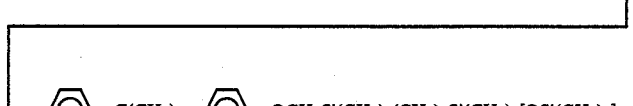
Formula 7

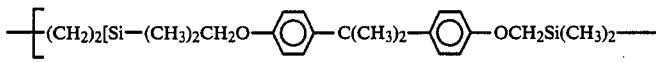

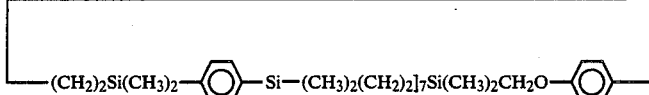

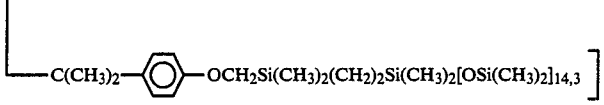

The preferred compositions according to the present invention are those which comprise from 100 to 20 parts by weight of copolymer and from 0 to 80 parts by weight of a solvent or diluent, the optimum quantity of solvent or diluent depending to a large extent on the number average molecular mass and hence on the viscosity of the copolymer employed in practice in a given solvent.

The more particularly recommended among these are those in which the copolymer corresponds to the formula (I) or (II), in which formulae:
R denotes a methyl radical,
Z denotes a para-phenylene radical,
X denotes a radical chosen from the radicals:

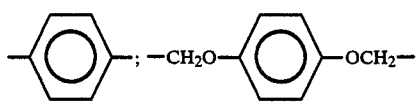

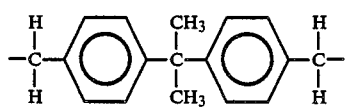

and/or which comprise a solvent or diluent chosen from those already mentioned as diluents which can be employed in the hydrosilylation reactions hereinbefore.

In formula (I) or (II) Y preferably denotes an ethylene group.

The compositions advantageously contain from 20 to 70 parts by weight of copolymer with 80 to 30 parts by weight of solvent or diluent.

The solvent or diluent is advantageously chosen from chlorinated or unchlorinated aromatic hydrocarbons and chlorinated alkanes mentioned earlier; toluene is more particularly suitable for this purpose.

The compositions according to the invention may, of course, contain minor quantities of adhesion promoters and/or nucleating agents or even, within the scope of certain special applications, of peroxides which will limit the "reversible" nature after use of these compositions.

As was indicated at the beginning of the present description, the potentially adhesive electrically conductive compositions according to the invention are characterized in that they are capable of being shaped without recourse to chemical reactions such as crosslinking, addition and condensation. These compositions are stable in storage even at temperatures of the order of 100° C. and easy to handle, especially by virtue of the fact that they are "single-component".

In the presence of solvent or diluent and/or when their temperatures are raised to a temperature not exceeding either the boiling point of the solvent or diluent or 250° C. in the absence of solvent or diluent, they may take the appearance of a paste or of a more or less viscous liquid and may be given the form of a film-forming collodion. They may also be taken to a rheological state which is compatible with serigraphic printing techniques and may be employed for the adhesive bonding of components of complex surface geometry.

The potentially adhesive electrically conductive compositions according to the invention permitting bonding between two devices without welding, in the absence of elevated temperature and/or pressure, may be employed in the adhesive bonding of integrated circuits or other devices which are fragile or tricky to handle.

when applied in the molten state at a temperature of the order of 120° to 200° C. depending on the structure of the rigid sequence of the copolymer, they may be extruded or injection- or compression-moulded.

These compositions may be used as a starting material for the manufacture of a preform such as a sheet, a tape, a tablet and more generally a self-supporting film whose thickness will generally attain from 110% of the average size of the electrically conductive particles to 100 microns, it being also possible to contemplate greater thicknesses. These films have mechanical properties which are sufficient to enable them to be handled by a machine without being reinforced, which is noteworthy, bearing in mind the fact that the electrically conductive fillers, especially those of silver, tend to have an embrittling effect in the quantities in which they are employed to produce electrical conductivity.

From the preform it is possible to cut out, for example, tablets of suitable size using conventional cutting techniques such as sawing or the use of cutting discs, it being possible for the rejects such as defective tablets to be recycled to the preparation of the preform merely by melting or dissolving in a solvent by virtue of the reversible nature of the adhesive.

As indicated at the beginning of the present description, the conductive adhesive film produced from a potentially adhesive electrically conducting composition according to the present invention may be either dissolved in a suitable solvent or remelted thermally, even when it has been inserted between two surfaces in order to fasten them to each other. It is therefore possible to remove a defective adhesively bonded component in order to replace it altogether or to replace it after repair. The polymer solution may once again be used for the preparation of a conductive adhesive film.

It is also possible to impregnate a fibrous sheet, for example a glass fibre cloth in order to form a reinforced film if need be.

The production of a self-supporting film may be carried out by spreading or deposition with a doctor blade on a nonadhesive surface such as a surface coated with Teflon ®, with a dissolved or molten composition.

The conductive and flexible adhesive film which is obtained has elastomeric properties which enable it to withstand without appreciable damage the stresses associated with differential thermal changes. This film is normally not adhesive at ordinary ambient temperature (of the order of 25° C.), and this is of considerable advantage.

The adhesion of the film to a surface is produced by heat-welding at a temperature above that of the melting point of the rigid sequence of the copolymer and below 220° C.

The potentially adhesive electrically conductive compositions such as the films according to the invention possess both an excellent resistance to chemical and atmospheric agents and easy processability, as has just been indicated, since their adhesiveness is normally zero at ambient temperature and at temperatures of the order of 100° C. Furthermore, bearing in mind their method of preparation (substantially pure monomers, "clean" reactions via the hydrosilylation technique), and the absence of chemical reactions during the fabrication stage, the potentially adhesive electrically conductive compositions like the films, according to the invention, are of very high chemical purity and, in particular, have a very low content of migrating ions.

The potentially adhesive electrically conductive compositions (such as the films) according to the present invention may be employed in the absence of any solvent, and in certain compositions this represents a major advantage. In fact, they may be employed merely by heating a tablet or a small, more or less pasty or powdery lump of potentially adhesive electrically conductive composition up to the softening point of the assembly, followed by keeping under pressure the surface to be adhesively bonded and the softened adhesive, or a layer of conductive adhesive which is softened and sandwiched between two surfaces to be joined together. The use is therefore instantaneous.

So far as surfaces which are adherent or capable of being joined together by means of a layer of potentially adhesive electrically conductive composition are concerned, there may be mentioned silicon wafers and chips cut from such wafers and, more particularly, the back of these substrates, that is to say the surface opposed to that which is generally polished, on which the integrated circuits are developed.

There may also be mentioned the surface of an alumina board, it being possible for the adherent face (like that of the silicon chip or wafer) to be coated with gold or with silver, the noncontinuous collective interconnection surfaces employed in the manufacture of hybrid circuits, and copper, chromium, nickel, titanium, tungsten or gold surfaces. There may furthermore be mentioned deformable metallic or nonmetallic surfaces, for example the surface of a polyimide film. The adherent surface may be noncontinuous, may take the form of a tape several tens of micrometers in thickness, etc.

A tape made from a potentially adhesive electrically conductive composition according to the invention, even when not coated with a metal tape, may be employed as temporary conveyance in the technique of automatic belt conveying.

Various uses and assembly methods will be apparent to the person skilled in the art, bearing in mind the detailed information at the beginning of the present description and the number of illustrations which have just been discussed.

The following examples illustrate the invention.

EXAMPLE I (1) Preparation of a polyorganosiloxane multiblock copolymer in which the average formula of the repeat units is the following:

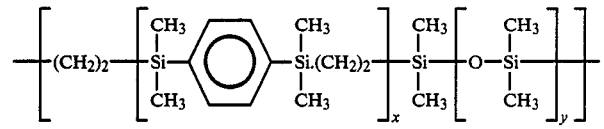

with $x=11.8$ and $y=110$ by reaction of 1,4-bis(dimethylvinylsilyl)benzene,

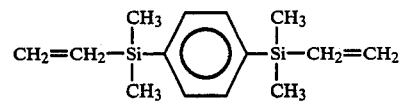

with 1,4-bis(dimethylsilyl)benzene:

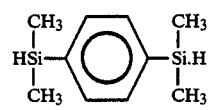

(a) Preparation of 1,4-bis(dimethylvinylsilyl)benzene:

Into a 6-liter glass reactor equipped with a stirring system, a vertical condenser, a thermometer and a nitrogen inlet, are charged:

150 cm$^3$ of a solution produced by mixing 668 g of p-(vinyldimethylsilyl)chlorobenzene with 1,020 cm$^3$ of tetrahydrofuran, 90 g of magnesium turnings, and 3 cm$^3$ of methyl iodide.

The mixture is heated slightly, with stirring, so as to initiate the formation of the magnesium derivative of formula:

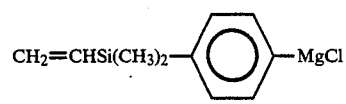

After initiation, the remainder of the solution is added over a period of 3 h 40 minutes; during this addition the temperature of the reaction mixture rises from 63° C. to 74° C.

The reactor contents are then heated to about 70°–75° C. for 10 h. At the end of this period the contents are diluted by introducing 1,000 cm³ of isopropyl ether and 430 g of vinyldimethylchlorosilane are then added over 10 minutes. At the end of this addition the temperature of the reaction mixture reaches 66° C.; the mixture is heated for 2 hours to about 72° C., and is then hydrolysed with 800 cm³ of an aqueous solution containing 0.8 mole of HCl, and the organic phase is separated from the aqueous phase. Distillation of the organic phase makes it possible to obtain 403 g of 1,4-bis(dimethylvinylsilyl)benzene, boiling at about 83° C. at 0.35 mm of mercury.

(b) Preparation of 1,4-bis(dimethylsilyl)benzene:

Into a 3-liter glass reactor, equipped as described above, are charged:

25 cm³ of a solution produced by mixing 147 g of paradichlorobenzene with 300 cm³ of tetrahydrofuran, 49 g of magnesium turnings (substantially 2 moles), and a few crystals of iodine.

The mixture is heated gently, with stirring, so as to initiate the formation of the magnesium derivative of formula:

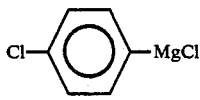

After initiation, the remainder of the solution is added over a period of 1 h 30 minutes; during this addition the temperature of the reaction mixture rises from 50° to 65° C.

The reactor contents are then heated to about 50° C. for 3 h 15 minutes. At the end of this period 94.5 g (1 mole) of dimethylchlorosilane are added over a period of 10 minutes.

The contents are then diluted by introducing 800 cm³ of cyclohexane.

The mixture obtained is heated to about 60° C. and 94.5 g (another mole) of dimethylchlorosilane are then added over a period of 1 h 45 minutes.

The reaction mixture is heated to about 65° C. for 40 h and is then hydrolysed with 500 cm³ of an aqueous solution containing 0.5 mole of HCl.

The organic phase is separated from the aqueous phase and its distillation makes it possible to obtain 87 g of 1,4-bis(dimethylsilyl)benzene boiling at about 104°–105° C. at 19 mm of mercury.

(c) Stage 1 of the preparation of the copolymer:

Into a 1-l reactor equipped with a stirring system, a condenser, a thermometer and a nitrogen inlet, are charged:

25.52 g (0.103 mole) of 1,4-bis(dimethylvinylsilyl)benzene, prepared as described above under (a), 16.98 g (0.0875 mole of 1,4-bis(dimethylsilyl)benzene, prepared as described above under (b), and 110 g of toluene.

The mixture is stirred under a stream of nitrogen and is gradually heated to 70° C. When this temperature has been reached, heating is stopped and 5 cm³ of a catalyst solution based on chloroplatinic acid, i.e. $1.8 \times 10^{-5}$ gram-atom of platinum, are added.

This produces a temperature rise of about 40° C. Heating is recommenced and is adjusted so as to maintain a slight reflux of toluene and the heating is continued under these conditions for 1 hour.

(d) Stage 2 of the preparation of the copolymer:

127.5 g of an α,ω-dihydrodimethylsiloxane with a number average molecular mass of 8,000 g/mole and 250 ml of toluene are then added to the contents of the reactor.

60 ml of the abovementioned catalyst solution, i.e. $10^{-4}$ gram/atom of platinum are also added, and the heating is continued under reflux for 2 hours.

Then, the copolymer solution whose temperature is then 65° C. is poured into 1,800 cm³ of absolute ethanol with energetic stirring. This treatment results in the coagulation of the copolymer in the form of elastic white flocks.

This precipitate is then washed with 2,000 ml of absolute alcohol and is then dried at 80° C. for 64 hours under reduced pressure. This produces 144 g of dry copolymer, whose intrinsic viscosity, measured in $CHCl_3$ at 20° C., is 0.75 dl/g.

(2) Preparation of a silver-filled flexible film:

Into a glass reactor equipped with stirring and purged with a stream of nitrogen are introduced:

3.0007 g of copolymer, and 9 cm³ of toluene.

This mixture is stirred and heated to 85° C.

As soon as the copolymer appears to have dissolved completely, gradual addition of 14.6413 g of silver powder is commenced.

The suspension which is produced is stirred slowly for 1 hour. The suspension is then spread out while hot onto a nonadhesive plane surface (a Teflon ® plaque).

The solvent is evaporated off in an oven at 100° C., under reduced pressure, for 1 hour.

This produces a flexible film, capable of being handled, a few tens of microns in thickness (L=10 cm, L=5 cm, thickness: 90 microns).

(3) Measurement of electrical conductivity:

A strip 6 cm in length and 3 mm in width is cut out of the film whose preparation is described above, and its electrical resistance is measured.

The following is found: Volume resistivity: $3.5 \times 10^{-4}$ ohm cm.

(4) Ionic purity:

In order to be capable of being used for the adhesive bonding of electronic components, an adhesive must have sufficiently low contents of extractable * impurity ions.

It is found that this is so in the case of the film whose preparation has been described above:

$Na^+$: 1.4 ppm $K^+$: 0.6 ppm $Cl^-$: 8.2 ppm extraction conditions: 20 hours at 105° C. in a Parr bomb; 1 g of film cut into pieces, with 15 cm³ of water.

(5) Adhesive bonding of a component with the aid of the film prepared in this manner:

The film was used for the adhesive bonding of silicon components onto alumina substrates.

The procedure was as follows:

A preform whose dimensions are slightly larger than that of the "chip" to be adhesively bonded is cut out of the film.

This preform is placed between the alumina substrate and the backface of the "chip".

The "sandwich" formed in this manner is then placed between the platens of a heated press.

After pressure has been applied, the component fastened onto the alumina substrate is withdrawn from the press and cooled to ambient temperature.

Temperature of the press platens: 210° C., force applied to the "chip": approximately 5 daN (for approximately 1 s), number of adhesive bondings produced: 5.

The shear stress which needs to be applied in order to strip, at 25° C., the component from its alumina support has been measured with the aid of a Dage Microtester 22 apparatus (die-shear test).

Mean value obtained in 5 tests: 1.3 MPa.

EXAMPLE 2

(1) Preparation of a polyorganosiloxane multiblock copolymer in which the average formula of the repeat units corresponds to that of Example 1.

This preparation is performed using a process similar to that described for Example 1.

(a) First stage:

Into a 250-ml glass reactor are charged:

6.9881 g (0.0283 mole) of 1,4-bis(dimethylvinylsilyl)benzene, 4.6487 g (0.0239 mole) of 1,4-bis(dimethylsilyl)benzene, and 34.9 g of toluene.

This mixture is stirred under a stream of nitrogen and is gradually heated up to 70° C.

With the heating stopped, 0.5 cm$^3$ of a catalyst solution based on chloroplatinic acid, containing $3.3 \times 10^{-6}$ gram-atom of platinum per cm$^3$, is added.

This results in a temperature rise of 23° C.

Heating is recommenced and is adjusted so as to maintain a gentle reflux of toluene; heating is applied under these conditions for 1 hour.

(b) Second stage:

34.914 g of an α,ω-dihydropolydimethylsiloxane with a number average molecular mass of 8,000 g/mole and 67.8 g of toluene are then added to the contents of the flask.

0.8 cm$^3$ of the precipitated catalyst solution are also added and then the heating and stirring are continued for approximately 2 hours. The hot copolymer solution is then coagulated in 1 liter of absolute ethanol with vigorous stirring.

The elastic white flocks which are produced are finally washed with 1 l of absolute ethanol and are then dried in the oven. Approximately 42 g of dry copolymer are obtained.

(2) Production of small moulded plaques made of this polymer:

These flocks can be compression moulded (50 kg/cm$^2$ for 10 minutes) at 180° C.

The moulded plaques (2 mm thickness) which are produced in this manner are transparent and have the following properties:

Tensile strength at 20° C.: 86 kg/cm$^2$ (NFT Standard 46002),

Elongation at break at 20° C.: 770% (NFT Standard 46002).

In addition, the intrinsic viscosity of the copolymer was measured in CHCl$_3$ at 20° C.: 0.75 dl/g.

(3) Production of an electrically conductive flexible film and its characteristics:

An electrically conductive flexible film was prepared by adding:

8.3708 g of silver powder to a solution of 2.0158 g of copolymer in 6.9393 g of toluene.

The preparation of this film, as well as the tests employed to characterize it, were performed using the procedures described earlier.

Characteristics of the adhesive produced:

silver content (%): 80.6 film thickness: 55 micrometers contents of extractable ions:

Na$^+$ = 0.3 ppm

K$^+$ = 0.1 ppm

Cl$^-$ = 4.3 ppm volume resistivity: $1.5 \times 10^{-3}$ ohm cm shear strength (die-shear test): 0.75 MPa.

loss in weight at 300° C.: less than 0.4% (by thermogravimetric analysis).

I claim:

1. An electrically conductive, potentially adhesive composition which comprises
   (a) a thermoplastic polyblock organopolysiloxane copolymer having elastomeric properties and consisting of a plurality of repeat units corresponding to formula I, formula II or a mixture thereof

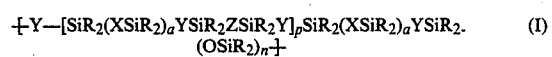

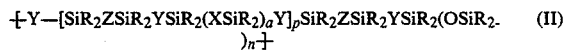

wherein
   Y, which are identical or different, denote linear or branched alkylene radicals containing 2 to 6 carbon atoms;
   R, which are identical or different, denote alkyl and haloalkyl radicals containing 1 to 4 carbon atoms, cycloalkyl radicals containing 3 to 8 carbon atoms, and aryl and haloaryl radicals containing 6 to 8 carbon atoms;
   X, which are identical, denote a linear or branched alkylene radical containing 1 to 8 carbon atoms, a divalent radical corresponding to formula III $$-(CH_2)_x-Q-T-Q-(CH_2)_x- \qquad (III)$$

in which
   Q, which are identical, denote one of the groups —O— or —OCO— (—OCO— being linked to T via the radical —CO—);
   T denotes a monocyclic divalent hydrocarbon radical containing 6 to 8 carbon atoms or a divalent organic radical containing 10 to 22 carbon atoms consisting of 2 hydrocarbon rings fused to each other or linked by a valency bond or by one of the groups of formulae —O—, —CH$_2$—, —C(CH$_3$)$_2$— or —Si(R'-)$_2$—, (R' being an alkyl radical containing 1 to 3 carbon atoms), and
   x, which are identical, denote 1, 2 or 3, or a divalent hydrocarbon radical corresponding to formula IV $$-(CH_2)_b-T-(CH_2)_b- \qquad (IV)$$

in which
   T has the meaning given in formula III, and
   b, which are identical, denote 0, 1 or 2;

Z, which are identical, have the meaning given for X, but cannot correspond to formula III, a denotes 0 or 1,
p denotes any number from 1 to 120, and
n denotes any number from 1 to 1000, and (b) an effective amount, sufficient to afford electrical conductivity to the composition, of particles with at least the surface of said particles being electrically conductive.

2. Composition according to claim 1, characterized in that it also contains a solvent or diluent.

3. Composition according to claim 2, characterized in that the solvent or diluent represents from 0 to 80 parts by weight, with from 100 to 20 parts by weight of copolymer.

4. Composition according to claim 2, characterized in that the solvent or diluent is selected from the group consisting of aliphatic and alicyclic hydrocarbons, halogenated or otherwise substituted,
aromatic hydrocarbons, halogenated or otherwise substituted, and
aliphatic esters of monocarboxylic acids.

5. Composition according to claim 2, characterized in that the solvent or diluent is selected from the group consisting of chlorinated aliphatic hydrocarbons, and aromatic hydrocarbons, halogenated or otherwise substituted.

6. Composition according to claim 2, characterized in that the diluent or solvent is toluene.

7. Composition according to claim 2, characterized in that the solvent or diluent represents from 30 to 80 parts by weight, with 70 to 20 parts by weight of copolymer.

8. Composition according to claim 1, characterized in that the particles of component (b) are particles of silver.

9. Composition according to claim 8, characterized in that the particles of silver have a mean size of between 0.1 and 50 microns and in that they represent from 60 to 85% by weight of the solids content of the composition.

10. Composition according to claim 1, characterized in that the copolymers of component (a) contain, in their repeat units, from 10 to 80% by weight of diorganopolysiloxane blocks —SiR$_2$(OSiR$_2$)$_n$—.

11. A composition according to claim 1 where in the thermoplastic polyblock organopolysiloxane copolymer of component (a)

Y denotes ethylene,
R denotes methyl, ethyl, n-propyl or phenyl, and
X and Z denote radicals selected from the group consisting of ethylene, 1,4-butylene, radicals of formula III in which T denotes

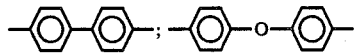

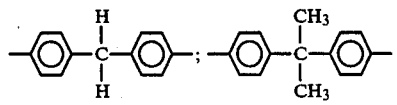

x and Q having the meanings given in claim 1, and divalent radicals of formula IV

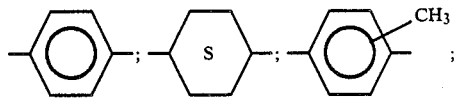

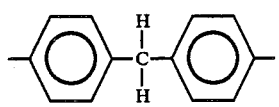

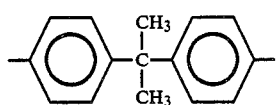

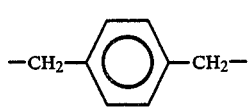

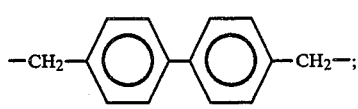

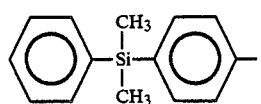

p denotes any number from 1 to 80, and
n denotes any number from 1 to 400.

12. A composition according to claim 1 where in the thermoplastic polyblock organopolysiloxane copolymer of component (a)

R denotes methyl,
X and Z have only the meanings given for Z, and
a is 1.

13. A composition according to claim 1 where in the thermoplastic polyblock organopolysiloxane copolymer of component (a)

R denotes methyl,
Z denotes p-phenylene, and
X denotes

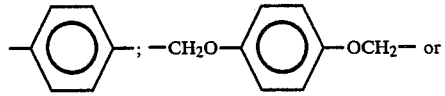

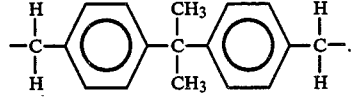

14. A composition according to claim 1 wherein the conductive particles of component (b) are carbon, titanium carbide, silver or gold.

15. A composition according to claim 14 wherein the conductive particles are carbon.

16. A composition according to claim 14 wherein the conductive particles are titanium carbide.

* * * * *